United States Patent [19]
Buck

[11] Patent Number: 6,163,462
[45] Date of Patent: Dec. 19, 2000

[54] STRESS RELIEF SUBSTRATE FOR SOLDER BALL GRID ARRAY MOUNTED CIRCUITS AND METHOD OF PACKAGING

[75] Inventor: Roy V. Buck, Oak Ridge, N.C.

[73] Assignee: Analog Devices, Inc., Norwood, Mass.

[21] Appl. No.: 08/986,603

[22] Filed: Dec. 8, 1997

[51] Int. Cl.⁷ ........................................ H05K 1/11
[52] U.S. Cl. .................. 361/767; 361/760; 361/777; 361/779; 361/790; 361/784; 174/250; 174/255; 174/260; 174/262; 228/179; 228/180.1; 228/180.2
[58] Field of Search ..................... 361/767, 760, 361/777, 779, 784, 785, 790, 768; 174/250, 260, 255, 262; 228/179, 180.1, 180.2; 257/747

[56] References Cited

U.S. PATENT DOCUMENTS

| | | | |
|---|---|---|---|
| 5,477,933 | 12/1995 | Nguyen | 174/262 |
| 5,499,444 | 3/1996 | Doane, Jr. et al. | 29/830 |
| 5,598,036 | 1/1997 | Ho | 257/38 |
| 5,620,927 | 4/1997 | Lee | 29/841 |
| 5,652,185 | 7/1997 | Lee | 437/219 |
| 5,663,594 | 9/1997 | Kimura | 257/666 |
| 5,874,776 | 2/1999 | Kresge et al. | 257/747 |

*Primary Examiner*—Jeffrey Gaffin
*Assistant Examiner*—David Foster
*Attorney, Agent, or Firm*—Koppel & Jacobs

[57] ABSTRACT

A stress relief substrate having a pair of ball grid arrays (BGAs) is interposed between a PC board and an electrical component. The BGAs are electrically connected through vias in the stress relief substrate to connect component circuitry to the PC board. In one embodiment, the BGAs are offset on a flexible substrate so that there is some open space between the edges of electrically connected solder balls. This allows the substrate to warp during thermal cycling and absorb the stress caused by TCE mismatch. In another embodiment, the BGAs are aligned on a rigid substrate that is formed with holes interposed between the solder balls. This reduces the amount of material that interconnects the solder balls so that the substrate tends to flex rather than transfer the TCE stress to the solder balls.

19 Claims, 4 Drawing Sheets

STRESS RELIEF SUBSTRATE FOR SOLDER BALL GRID ARRAY MOUNTED CIRCUITS AND METHOD OF PACKAGING

BACKGROUND OF THE INVENTION

1. Field of the Invention

This invention relates to electrical components that are mounted on printed circuit (PC) boards using a ball grid array (BGA) and more specifically to relieving stress on the ball joints caused by thermal coefficient of expansion (TCE) mismatch between the electrical component and the printed circuit (PC) board.

2. Description of the Related Art

Historically, integrated circuits (ICs) have been mounted on leadframes and packaged in ceramic or plastic materials with the fingers, e.g. leads, of the leadframes extending out of the sides of the package. The most common package is a Dual-in-line package (DIP), which is rectangularly shaped with an equal number of leads extending from both sides. Quad packages are typically square and have leads distributed around their circumference. Ceramics are usually used for state-of-the art devices, where reliability and a hermitic seal are required. Plastics are usually better for more mature commercial products where cost is paramount and hermeticity is not required.

The packaged ICs are surface mounted onto PC boards by soldering their leads onto contact pads. The leads are typically soldered by screen-printing solder paste onto the contact pads, attaching the package, and then reflowing the solder by vapor phase, infra-red, or wave reflow. The contact pads are connected through traces on the multi-layer PC board to other ICs or circuitry.

As very large scale integration (VLSI) technology advances, the IC device-size shrinks and the lead count grows. Using conventional packaging techniques, the space required for interconnection becomes a major fraction of the chip area, which in turn reduces the available space for the active device. To overcome this problem, packaged ICs and unpackaged flip-chip devices 10 are fabricated with a ball grid array (BGA) 12 on their bottom surfaces to provide I/O interconnections for circuitry 14 as shown in FIG. 1. The BGAs are aligned with the contact pads 16 of the PC board 18 and reflow soldered. This approach increases both the number of leads per package and the size of the active device.

Although the use of BGAs overcomes the I/O problem between the ICs and the PC board, the solder joints between the BGA and the package and between the BGA and the PC board are more susceptible to thermal coefficient of expansion (TCE) mismatch than the conventional surface mounting techniques. When undergoing thermal cycling, the TCE mismatch between the PC board and the package produces stress on the solder joints. This stress causes microcracks to appear in the joints, which eventually causes them to fail.

Plastic packages used in commercial products exhibit TCEs close to that of a standard epoxy-based PC board, which is approximately 17 parts per million (ppm). As a result, plastic packages, on average, routinely withstand 4–5 thousand thermal cycles between –40° C. and 125° C. prior to failure of a single interconnection. Conversely, ceramic packages exhibit a TCE of approximately 7 ppm. The amount of stress produced by this mismatch would reduce the reliability to approximately 100 thermal cycles, which is unacceptable.

Several different techniques have been tried to improve the reliability of ceramic packages. First, crack resistant alloys have been developed. However, these alloys only improve reliability to 200–400 cycles. Second, solder columns that are 3–4 times taller than the solder balls have been used. This allows the joints to flex and absorb some of the stress so that the package can withstand approximately 1000 thermal cycles. However, the solder columns are very fragile and susceptible to breakage during packaging. Lastly, the PC boards have been fabricated with a metal core to reduce the TCE mismatch. However, these boards are very expensive to produce and difficult to reflow solder. Ceramic boards may be used but they are limited in size and also very expensive. As a result, BGA attachment of ceramic packages has been abandoned in favor of the more reliable surface mounting technology.

Flip-chip devices also have a very low TCE, approximately 4.7 ppm for silicon based devices. To absorb the stress caused by the mismatch, a liquid adhesive is wicked around the solder bumps via capillary action to underfill the flip-chip device. The adhesive must be thin enough to flow easily but not leave voids. Furthermore, the curing temperature cycle stresses the flip-chip device reducing its reliability. Note, underfilling cannot be used with ceramic packages because the spacing between the package and the PC board is too great to provide adequate capillary action.

SUMMARY OF THE INVENTION

In view of the above problems, the present invention relieves the stress on the ball joints caused by TCE mismatch between the PC board and an electrical component thereby increasing the number of thermal cycles the component can experience prior to ball joint failure.

This is accomplished by interposing a flexible interface between ball grid arrays to interconnect an electrical component to a PC board. When the package undergoes thermal cycling, the TCE stress is absorbed by the stress relief substrate rather than being transferred to the solder joints.

In one embodiment, the ball grid arrays are offset on a flexible substrate so that there is some open space between the edges of electrically connected solder balls. This allows the substrate to warp during thermal cycling and absorb the stress caused by TCE mismatch. In another embodiment, the ball grid arrays are aligned on a rigid substrate that is formed with holes interposed between the solder balls. This reduces the amount of material that interconnects the solder balls so that the substrate tends to flex rather than transfer the TCE stress to the solder balls. In both cases, the stress relief substrate can be formed without deviating from the current industry standard for center-to-center spacing of the solder balls.

The component can be mounted onto the PC board in different ways. One approach is to provide a prepackaged component with a BGA, a stress relief substrate with a BGA, and a PC board. The substrate is soldered to the package's BGA by the manufacturer and the substrate's BGA is subsequently soldered to the PC board by the customer. Alternately, the component and stress relief substrate could be prepackaged leaving the customer only to mount the package on the PC board. Or, a stress relief substrate with electrically connected BGAs on its top and bottom surfaces can be interposed between and then soldered to the package and the PC board.

These and other features and advantages of the invention will be apparent to those skilled in the art from the following detailed description of preferred embodiments, taken together with the accompanying drawings, in which:

DETAILED DESCRIPTION OF THE INVENTION

The present invention provides a stress relief substrate interposed between ball grid arrays to interconnect an electrical component to a PC board. The stress relief substrate absorbs stress caused by TCE mismatch rather than transferring the stress to the ball joints. As a result, ceramic packages can be mounted using ball grid arrays rather than the conventional surface mounting in applications that demand high reliability over long lifetimes. The goal being to improve the reliability of ceramic packages to match that of plastic packages without sacrificing the hermetic properties associated with ceramic packages. Furthermore, flip-chips can be mounted without having to underfill them with an adhesive to absorb TCE mismatch stress.

Figure 1:
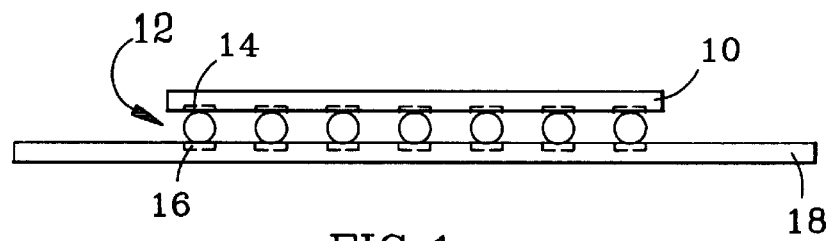
FIG. 1, as described above, illustrates a known ball grid array mounted circuit.
Figure 2:
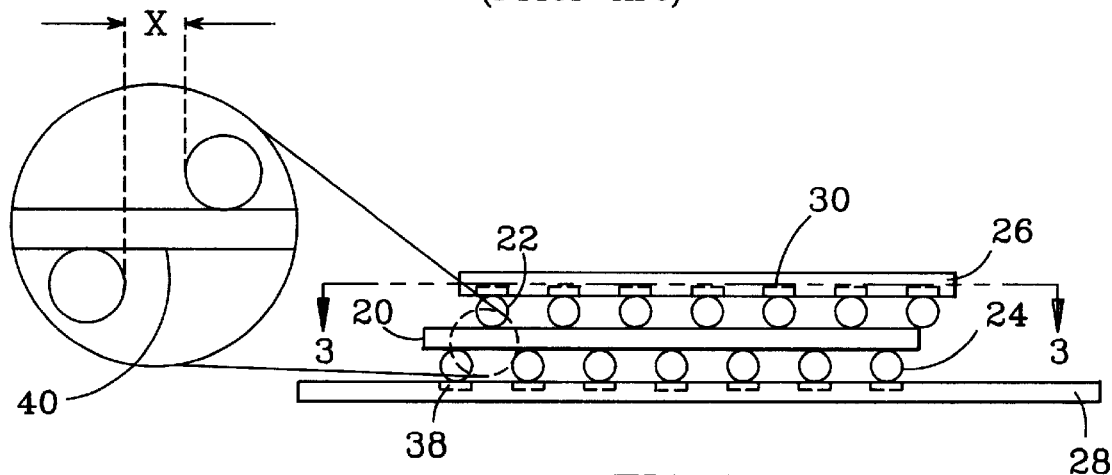
FIG. 2 is a side view of a first embodiment of a stress relief substrate in a ball grid array package in which the ball grid arrays are offset on a flexible substrate.
Figure 3:
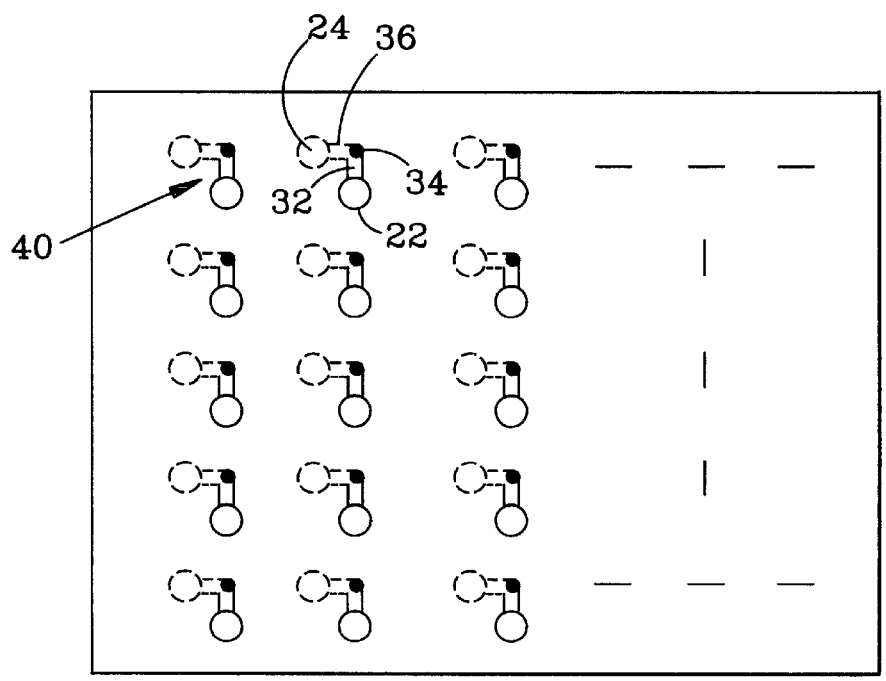
FIG. 3 is a plan view of the stress relief substrate shown in FIG. 2.

As shown in FIGS. 2 and 3, a stress relief substrate 20 is interposed between a pair of BGAs 22 and 24 to attach an electrical component 26 and a PC board 28. The BGAs are approximately 625–750 microns high when used in ceramic packages and approximately 125 microns high when used to attach flip-chips. BGA 22 is connected to contact pads 30 on component 26, which in turn are routed through vias to wire bonded ICs in the case of a ceramic package or to the flip-chip circuitry. The other side of BGA 22 is connected to traces 32 on the top surface of substrate 20, which are routed through vias 34 to traces 36 on the bottom surface of the substrate that are connected to BGA 24. The other side of BGA 24 is soldered to contact pads 38 on PC board 28, which are electrically connected to other BGA mounted components or surface mounted circuitry.

In the illustrated embodiment, stress relief substrate 20 is preferably a "flex" board that is made from a polyimide based material with adhesiveless copper to form the traces. Other flex materials such as polyester, Teflon, tedlar or nylon, for example, could be used. The flex board is suitably 6 to 125 microns thick with a TCE between 8 and 20 ppm, preferably midway between the component and board values. Alternately, substrate 20 could be a very thin rigid board made from standard FR4 material or from liquid crystal polymer resins.

BGAs 22 and 24 are offset with respect to each other so that pairs of electrically connected balls on opposing sides of substrate 20 are spaced apart by a distance x, suitably 125 microns. Offsetting the BGAs leaves a portion 40 of substrate 20 that will flex during thermal cycling to absorb TCE mismatch stress. This alleviates the stress on ball joints formed between the BGAs and component 26 and PC board 28. If the BGAs are aligned or overlap somewhat, the substrate will flex but to a much lesser degree.

The offset flex board structure provides high stress absorption capabilities and can be fabricated without affecting the size of standardized packages; 625–750 micron ball diameters, and 1.25 mm center-to-center spacings. Standard BGAs are available in partial or full array sizes having, for example, 36×36 balls on a half to two inch square substrate. However, these same flexible properties can be a drawback during processing, the flex board will tend to warp during attachment of the BGA and during attachment to the PC board.

Another advantage of the flex board substrate is that one or both of the BGAs can be attached to the substrate in a reel-to-reel process. One approach is to mask off the pads where the solder balls are to be attached and move the continuous reel of flex material through one or more plating baths with reflow between each until the desired solder ball thickness is achieved. Another approach is to screen print the flex reel with solder past and run it through reflow multiple times until the desired thickness is achieved. Alternately, the solder balls could be placed on the flex reel using an assembly machine and reflowed.

Figure 4:
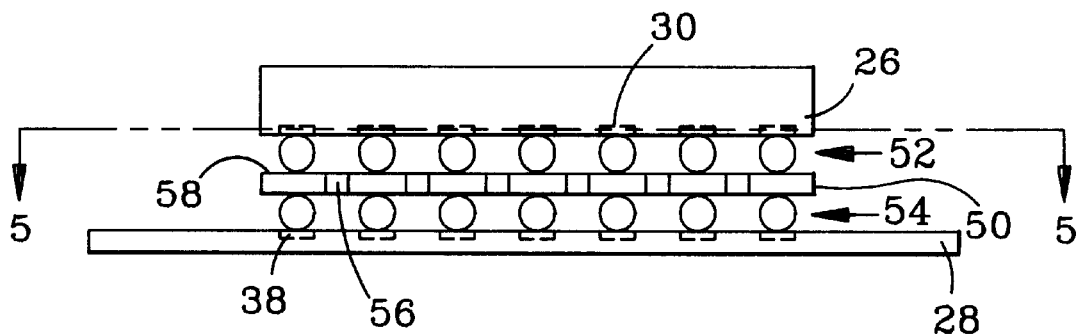
FIG. 4 is a sectional view of another embodiment of a stress relief substrate in a ball grid array package in which the ball grid arrays are aligned on a rigid substrate that is formed with holes interposed in the array.
Figure 5:
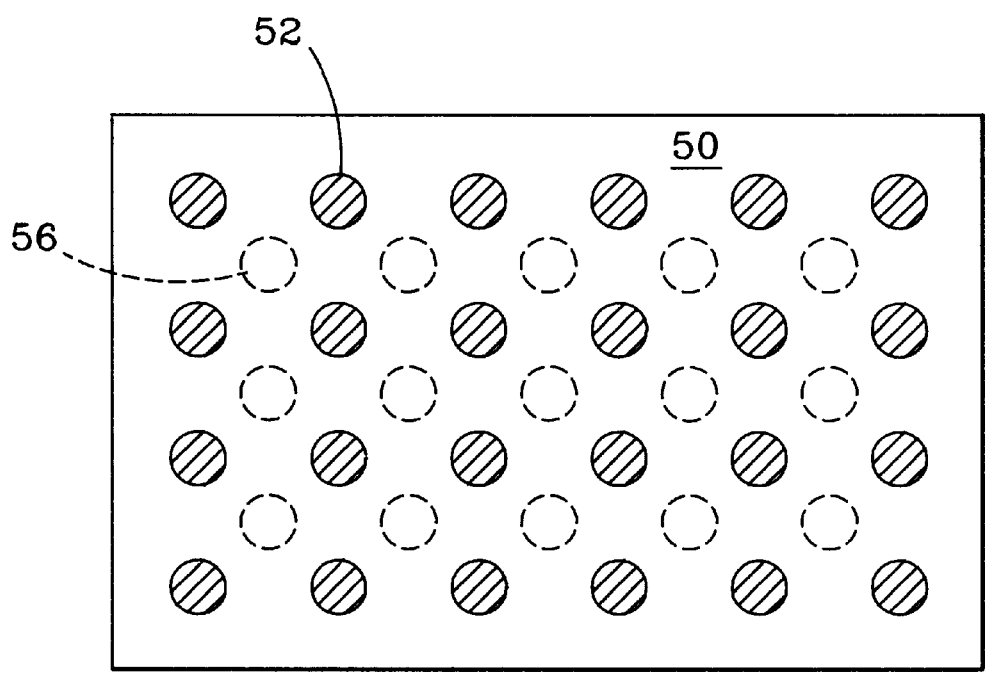
FIG. 5 is a plan view of the stress relief substrate shown in FIG. 4.

Another embodiment that sacrifices some absorption performance to improve handling is illustrated in FIGS. 4 and 5. Similar to the flex board structure, a stress relief substrate 50 is interposed between a pair of BGAs 52 and 54 to attach electrical component 26 and PC board 28. However, in this embodiment, substrate 50 is a "rigid" board that is suitably made from standard FR4 material, i.e. the same material used in the PC board, or a liquid crystal polymer resin. One or both of the BGAs are formed on the rigid board using a conventional screen printing process. The flex board is suitably 250 microns to 750 microns thick and typically exhibits a TCE close to that of the PC board. A rigid substrate with a TCE midway between the component and board values would be preferable.

A plurality of holes 56 are punched in the rigid board in the space between the individual balls in BGAs 52 and 54. The holes reduce the amount of material that interconnects BGAs 52 and 54 so that substrate 50 tends to flex rather than transfer TCE mismatch stress to the ball joints. As shown, BGAs 52 and 54 are preferably aligned and electrically connected through vias 58 in substrate 50 in order to maximize the amount of surface area in which holes can be punched. To obtain adequate flexure without sacrificing handling performance, a percentage of material removed by the holes in excess of 30% is preferred.

The BGA mounted circuits shown in FIGS. 2 and 4 can be assembled in variety of different ways depending upon the type of electrical component, the specific application, customer preference, etc. For example, flip-chips will often be fabricated with an array of indium or solder bumps which provide one of the BGAs. Similarly, ceramic packages are often formed with a solder BGA. Alternately, the substrate may be fabricated with both BGAs and then soldered to the electrical component and the PC board. The stress relief substrate may be provided as a component where the customer must assemble all of the pieces or it may be prepackaged with the electrical components so that the customer need only reflow solder it to the PC board.

Figure 6:
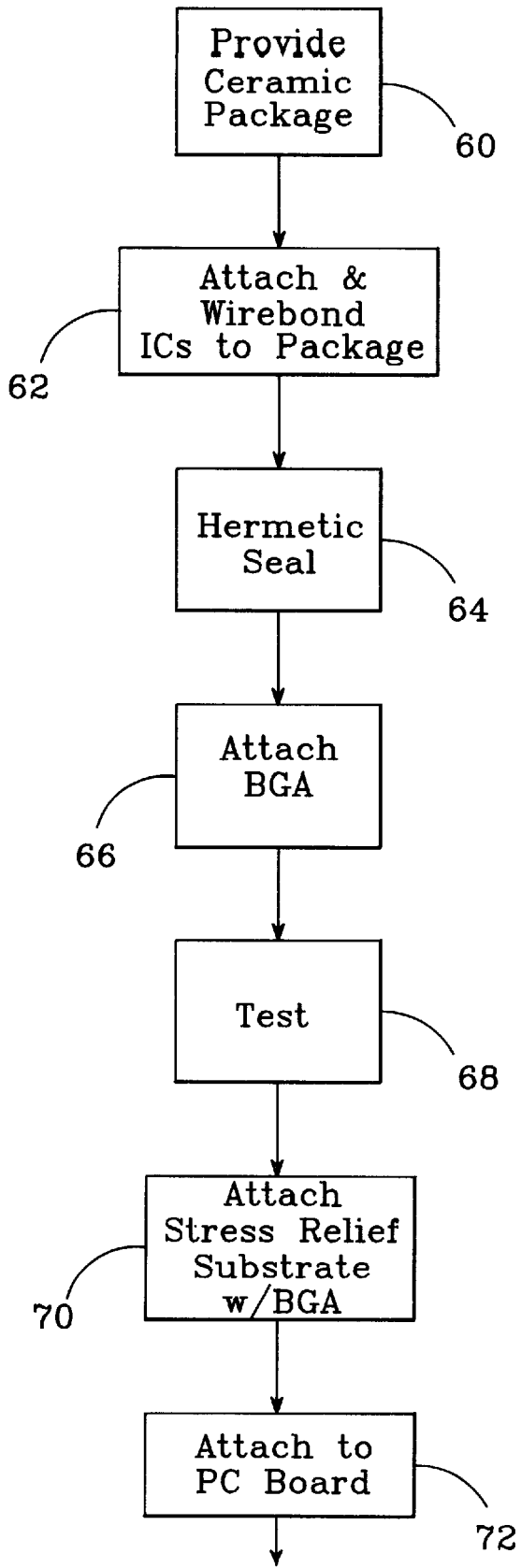
FIG. 6 is a flowchart of the CBGA processing to mount a stress relief substrate.

A typical process for mounting a stress relief substrate onto a ceramic package and attaching it to a PC board is illustrated in FIG. 6. A ceramic package is procured from a supplier (step 60). Ceramic packages resemble mini PC boards in that they have multiple layers with vias and traces providing I/O interconnection between an array of contact pads on its bottom surface and contact pads on its top surface. Thereafter, ICs are attached to the package and wirebonded to the contact pads (step 62). At this point, a preseal electrical test is conducted. If the part passes, the package is hermetically sealed using a resistance weld, solder seal, epoxy seal or glob top (step 64). Once sealed, the solder balls are attached to form a BGA (step 66). The package is retested, burned in, and then a final electrical test is conducted (step 68). This constitutes the typical CBGA package that is traditionally delivered to the customer for surface mounting to a PC board. Instead, a stress relief substrate having a backside BGA is soldered to the BGA (step 70). This step is typically done prior to delivering the assembly to the customer who then merely reflow solder the backside BGA to a PC board (step 72).

Figure 7:
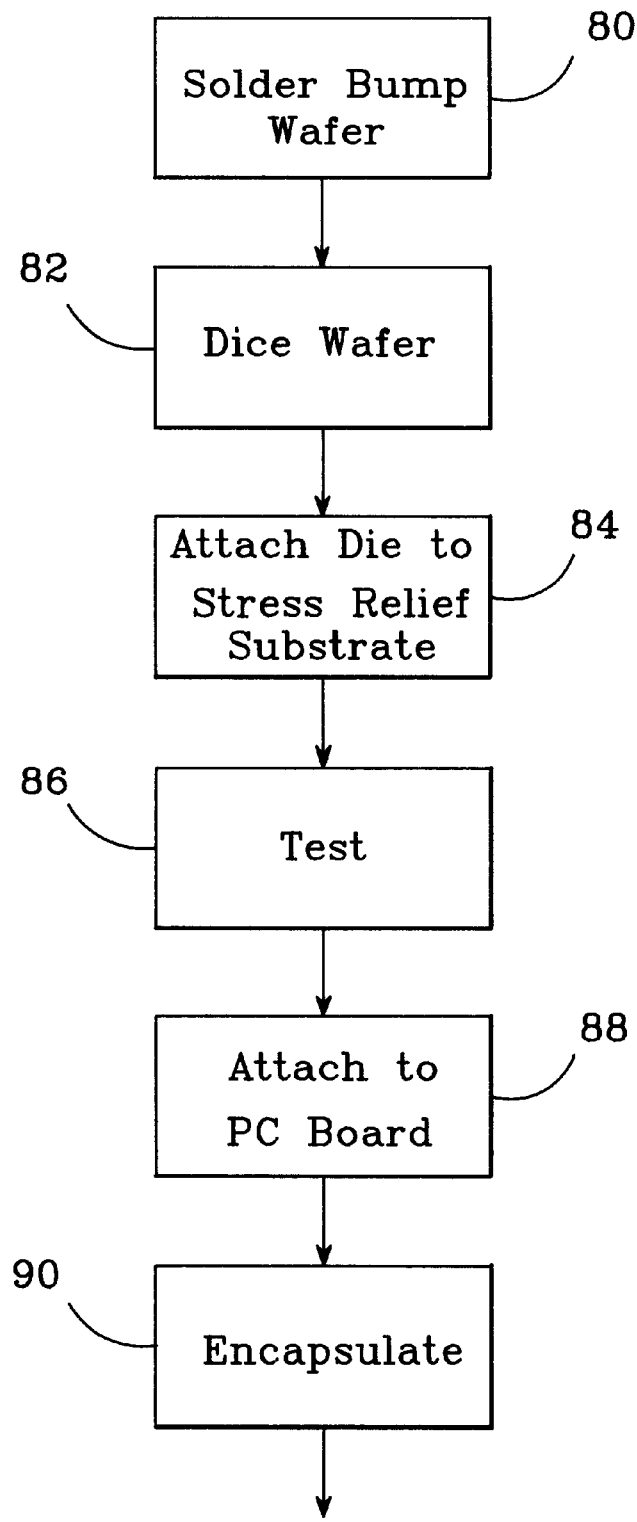
FIG. 7 is a flowchart of the flip-chip processing to mount a stress relief substrate.

One approach to mounting a stress relief substrate onto a flip-chip and attaching it to a PC board is illustrated in FIG. 7. The backside of a wafer, which has already undergone frontside processing to form the integrated circuitry, is solder/indium bumped (step 80). Thereafter, the wafer is diced into individual die (step 82) and the die are attached (soldered) to respective stress relief substrates, which have backside BGAs (step 84). It may be possible to dice the wafer after connection to one large stress relief substrate in order to achieve batch processing advantages. The flip-chip assemblies are electrical tested (step 86) and shipped to the customer for attachment to a PC board (step 88). The flip-chip is over coated (step 90) to encapsulate the device. Alternately, the assembly may be over coated prior to shipping. The advantage to the customer is improved reliability and fewer operations at the PC board assembly line.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A ball grid array (BGA) mounted circuit, comprising:
   a printed circuit (PC) board;
   a board BGA mounted on said PC board and formed of first solder balls that are arranged in a first array pattern;
   a stress relief substrate having a top surface and having a bottom surface on said board BGA;
   a component BGA on the top surface of said stress relief substrate and formed of second solder balls that are arranged in a second array pattern that is substantially identical to said first array pattern and that is laterally offset from said first array pattern, each of said second solder balls thus laterally offset from a corresponding one of said first solder balls and forming, with that first solder ball, one of a plurality of solder ball pairs;
   an array of electrical vias through said stress relief substrate with each of said vias positioned proximate to a respective one of said solder ball pairs;
   a plurality of first circuit traces positioned on the top surface of said stress relief substrate and each arranged to connect a respective one of said vias to the first solder ball of that via's respective solder ball pair;
   a plurality of second circuit traces positioned on the bottom surface of said stress relief substrate and each arranged to connect a respective one of said vias to the second solder ball of that via's respective solder ball pair; and
   an electrical component on said component BGA, said electrical component having a plurality of circuits that are connected to respective circuits on said PC board through said component BGA, said array of electrical vias and said board BGA;
   the first and second solder balls of each solder ball pair thus connected together and laterally offset from each other by a portion of said stress relief substrate that will flex during thermal cycling to absorb thermal coefficient of expansion (TCE) mismatch between said electrical component and said PC board.

2. The BGA mounted circuit of claim 1, wherein said board and component BGAs are offset with respect to each other so that pairs of electrically connected balls on opposing sides of the substrate are spaced apart leaving a portion of said substrate that will flex during thermal cycling to absorb the TCE mismatch stress.

3. The BGA mounted circuit of claim 2, wherein said stress relief substrate is formed from a rigid material but is thin enough to flex.

4. The BGA mounted circuit of claim 2, wherein said vias are spaced away from the balls in said board and component BGAs and connected to them by traces on the bottom and top surfaces of the substrate, respectively.

5. The (BGA) mounted circuit of claim 1,
   wherein said stress relief substrate has an array of holes that are spaced from said board and component BGAs and reduce the amount of material that interconnects the BGAs so that the substrate tends to flex rather than transfer stress to the balls.

6. The BGA mounted circuit of claim 5, wherein said stress relief substrate is formed from a rigid material that flexes due to the array of holes.

7. The BGA mounted circuit of claim 1, wherein the electrical component comprises a flip-chip.

8. The BGA mounted circuit of claim 7, wherein said electrical component, components BGA, and stress relief substrate are encapsulated as a package.

9. A ball grid array (BGA) mounted circuit, comprising:
   a printed circuit (PC) board;
   a board BGA mounted on said PC board;
   a stress relief substrate on said board BGA, said substrate having an array of electrical vias that extend from its bottom surface where they are in electrical contact with respective balls in said board BGA to its top surface;
   a component BGA on the top surface of said stress relief substrate and in electrical contact with respective vias in said array; and
   an electrical component on said component BGA, said electrical component having a plurality of circuits that are connected to respective circuits on said PC board through said component BGA, said array of electrical vias and said board BGA;
   said PC board and said electrical component respectively having a board thermal coefficient of expansion (TCE) and a component TCE that are mismatched and produce stress when subjected to a thermal cycle; and
   said stress relief substrate having a substrate TCE between said board TCE and said component TCE;
   wherein:
   said electrical component comprises a ceramic package; and
   said substrate TCE is between 8 and 20 parts per million;
   said stress relief substrate thus absorbing at least a portion of that stress that would otherwise be absorbed in the ball joints formed between the board BGA and the PC board and the component BGA and the electrical component.

10. A ball grid array (BGA) mounted circuit, comprising:

a printed circuit (PC) board;

a board BGA mounted on said PC board;

a stress relief substrate on said board BGA, said substrate leaving an array of electrical vias that extend from its bottom surface where they are in electrical contact with respective balls in said board BGA to its top surface;

a component BGA on the top surface of said stress relief substrate and in electrical contact with respective vias in said array; and an electrical component on said component BGA, said electrical component having a plurality of circuits that are connected to respective circuits on said PC board through said component BGA, said array of electrical vias and said board BGA;

said PC board and said electrical component respectively having a board thermal coefficient of expansion (TCE) and a component TCE that are mismatched and produce stress when subjected to a thermal cycle; and said stress relief substrate having a substrate TCE between said board TCE and said component TCE;

wherein said board and component BGAs are spatially aligned with each other;

said stress relief substrate thus absorbing at least a portion of that stress that would otherwise be absorbed in the ball joints formed between the board BGA and the PC board and the component BGA and the electrical component.

11. A ball grid array (BGA) mounted circuit, comprising:

a printed circuit (PC) board;

a board BGA mounted on said PC board;

a stress relief substrate on said board BGA, said substrate having an array of electrical vias that extend from its bottom surface where they are in electrical contact with respective balls in said board BGA to its top surface;

a component BGA on the top surface of said stress relief substrate and in electrical contact with respective vias in said array; and an electrical component on said component BGA, said electrical component having a plurality of circuits that are connected to respective circuits on said PC board through said component BGA, said array of electrical vias and said board BGA;

said PC board and said electrical component respectively having a board thermal coefficient of expansion (TCE) and a component TCE that are mismatched and produce stress when subjected to a thermal cycle; and said stress relief substrate having a substrate TCE between said board TCE and said component TCE;

wherein said electrical component comprises a hermetically sealed ceramic package;

said stress relief substrate thus absorbing at least a portion of that stress that would otherwise be absorbed in the ball joints formed between the board BGA and the PC board and the component BGA and the electrical component.

12. A ball grid array (BGA) mounted circuit, comprising;

a printed circuit (PC) board;

a board BGA mounted on said PC board;

a stress relief substrate on said board BGA, said substrate having an array of electrical vias that extend from its bottom surface where they are in electrical contact with respective balls in said board BGA to its top surface;

a component BGA on the top surface of said stress relief substrate and in electrical contact with respective vias in said array; and an electrical component on said component BGA, said electrical component having a plurality of circuits that are connected to respective circuits on said PC board through said component BGA, said array of electrical vias and said board BGA;

said PC board and said electrical component respectively having a board thermal coefficient of expansion (TCE) and a component TCE that are mismatched and produce stress when subjected to a thermal cycle; and said stress relief substrate having a substrate TCE between said board TCE and said component TCE;

wherein said electrical component is encapsulated on said PC board;

said stress relief substrate thus absorbing at least a portion of that stress that would otherwise be absorbed in the ball joints formed between the board BGA and the PC board and the component BGA and the electrical component.

13. A ball grid array (BGA) package, comprising:

an electrical component having a plurality of circuits, said component having a thermal coefficient of expansion (TCE);

a component BGA mounted on said component with respective balls in electrical contact with said circuits;

a stress relief substrate on said component BGA, said substrate having an array of electrical vias that extend from its top surface where they are in electrical contact with respective balls in said component BGA to its bottom surface; and a board BGA on the bottom surface of said stress relief substrate and in electric contact with respective vias;

wherein said stress relief substrate is formed from a rigid material and has an array of holes that are spaced from said component and board BGAs and reduce the amount of material that interconnects the BGAs so that the rigid material tends to flex rather than transfer stress to the balls;

said stress relief substrate thereby being capable of flexing to absorb TCE mismatch stress that would otherwise be absorbed in the ball joints formed between the component BGA and the electrical component;

wherein said component and board BGAs are offset with respect to each other so that pairs of electrically connected balls on opposing sides of the substrate are spaced apart leaving a portion of said substrate that will flex during thermal cycling to absorb the TCE mismatch stress;

said stress relief substrate thereby being capable of flexing to absorb TCE mismatch stress that would otherwise be absorbed in the ball joints formed between the component BGA and the electrical component.

14. A ball grid array (BGA) package, comprising:

an electrical component having a plurality of circuits, said component having a thermal coefficient of expansion (TCE);

a component BGA formed of first solder balls that are arranged in a first array pattern, said component BGA mounted on said component with respective balls in electrical contact with said circuits;

a stress relief substrate having a top surface on said component BGA and further having a bottom surface;

a board BGA on the bottom surface of said stress relief substrate and formed of second solder balls that are arranged in a second array pattern that is substantially identical to said first array pattern and that is laterally offset from said first array pattern, each of said second solder balls thus laterally offset from a corresponding one of said first solder balls and forming, with that first solder ball, one of a plurality of solder ball pairs;

an array of electrical vias through said stress relief substrate with each of said vias positioned proximate to a respective one of said solder ball pairs;

a plurality of first circuit traces positioned on the top surface of said stress relief substrate and each arranged to connect a respective one of said vias to the first solder ball of that via's respective solder ball pair; and a plurality of second circuit traces positioned on the bottom surface of said stress relief substrate and each arranged to connect a respective one of said vias to the second solder ball of that via's respective solder ball pair;

the first and second solder balls of each solder ball pair thus connected together and laterally offset from each other by a portion of said stress relief substrate that will flex during thermal cycling to absorb thermal coefficient of expansion (TCE) of said electrical component.

15. The flexible interface of claim 14, wherein said stress relief substrate is substantially 6 to 25 microns thick and has a TCE between 8 and 20 parts per million.

16. A flexible interface for mounting an electrical component on a printed circuit (PC) board, comprising:

a stress relief substrate having a top surface and a bottom surface;

a component ball grid array (BGA) formed of first solder balls that are positioned on the top surface of said stress relief substrate and arranged in a first array pattern;

a board BGA formed of second solder balls that are positioned on the bottom surface of said stress relief substrate and are arranged in a second array pattern that is substantially identical to said first array pattern and that is laterally offset from said first array pattern, each of said second solder balls thus laterally offset from a corresponding one of said first solder balls and forming, with that first solder ball, one of a plurality of solder ball pairs;

a plurality of electrical vias through said stress relief substrate with each of said vias positioned proximate to a respective one of said solder ball pairs;

a plurality of first circuit traces positioned on the top surface of said stress relief substrate and each arranged to connect a respective one of said vias to the first solder ball of that via's respective solder ball pair; and a plurality of second circuit traces positioned on the bottom surface of said stress relief substrate and each arranged to connect a respective one of said vias to the second solder ball of that via's respective solder ball pair;

the first and second solder balls of each solder ball pair thus connected together and laterally offset from each other by a portion of said stress relief substrate that will flex during thermal cycling to absorb thermal coefficient of expansion (TCE) mismatch between said electrical component and said PC board when they are respectively coupled to said component BGA and said board BGA.

17. The flexible interface of claim 16, wherein said component and board BGAs are laterally offset by substantially 125 microns.

18. The flexible interface of claim 16, wherein said stress relief substrate is formed of a polyimide-based material.

19. The flexible interface of claim 16, wherein said stress relief substrate is substantially 6 to 25 microns thick and has a TCE between 8 and 20 parts per million.

* * * * *